United States Patent
Lakra et al.

(10) Patent No.: US 6,686,565 B2
(45) Date of Patent: Feb. 3, 2004

(54) METHOD OF AN APPARATUS FOR HEATING A SUBSTRATE

(75) Inventors: Paul Lakra, Wembley (GB); Stephen James Butler, Wokingham (GB)

(73) Assignee: Planer Products, Limited, Sunbury (GB)

( * ) Notice: Subject to any disclaimer, the term of this patent is extended or adjusted under 35 U.S.C. 154(b) by 0 days.

(21) Appl. No.: 09/903,352

(22) Filed: Jul. 11, 2001

(65) Prior Publication Data

US 2002/0023946 A1 Feb. 28, 2002

(30) Foreign Application Priority Data

Jul. 28, 2000 (GB) ................................................. 0018416

(51) Int. Cl.$^7$ ............................. F27D 11/00; F27B 5/14; B23K 31/02
(52) U.S. Cl. ........................ 219/388; 219/390; 228/227; 228/102
(58) Field of Search ................................ 228/227, 219, 228/260, 102; 219/388, 390

(56) References Cited

U.S. PATENT DOCUMENTS

| | | | | |
|---|---|---|---|---|
| 4,224,927 A | * | 9/1980 | Patil ........................... 126/675 |
| 4,520,575 A | * | 6/1985 | Holmes et al. ............... 34/216 |
| 4,568,277 A | * | 2/1986 | MacInnes et al. ........... 432/120 |
| 4,750,664 A | | 6/1988 | Furtek ......................... 228/102 |
| 4,771,929 A | * | 9/1988 | Bahr et al. ................. 219/85.13 |
| 4,817,851 A | | 4/1989 | Kolesar et al. ............. 228/119 |
| 5,066,850 A | * | 11/1991 | Kondo ........................ 219/388 |
| 5,067,419 A | * | 11/1991 | Kobayashi et al. ......... 110/234 |
| 5,148,583 A | * | 9/1992 | Greenway .................... 26/2 R |
| 5,193,735 A | * | 3/1993 | Knight ........................ 219/388 |
| 5,520,320 A | * | 5/1996 | McKean et al. ............ 228/102 |
| 5,567,151 A | * | 10/1996 | Mizoguchi et al. ......... 219/388 |
| 5,573,688 A | * | 11/1996 | Chanasyk et al. .......... 219/388 |
| 5,860,472 A | * | 1/1999 | Batchelder .................. 165/185 |
| 5,901,462 A | * | 5/1999 | Rudd ........................... 34/274 |
| 6,106,281 A | * | 8/2000 | Materna ...................... 219/388 |
| 6,376,817 B1 | * | 4/2002 | McFadden et al. ......... 219/681 |
| 6,386,422 B1 | * | 5/2002 | Cheng et al. ................ 228/46 |
| 6,394,796 B1 | * | 5/2002 | Smith .......................... 432/19 |

* cited by examiner

Primary Examiner—M. Alexandra Elve
Assistant Examiner—L. Edmondson
(74) Attorney, Agent, or Firm—Wm. Bruce Day

(57) ABSTRACT

A method of uniformly or substantially uniformly heating at least one surface of a substrate, comprises the steps of supporting a substrate, generating a heated air flow, directing the heated air flow to heat a strip of a first surface of the substrate, and moving the flow path of the heated air in a direction transverse to the direction in which the heated air flow impinges on the substrate until the temperature of the whole or substantially the whole first surface of the substrate has been uniformly or substantially uniformly raised. Apparatus for performing this method is also disclosed.

10 Claims, 4 Drawing Sheets

METHOD OF AN APPARATUS FOR HEATING A SUBSTRATE

INTRODUCTION

This invention relates to a method of and apparatus for heating a substrate and more particularly, but not exclusively, to uniformly or substantially uniformly heating at least one surface of the substrate.

BACKGROUND TO THE INVENTION

It is often the case that, during a manufacturing process, a substrate is required to be heated. For example, when printed circuit boards (PCB's) are automatically soldered, it is desirable that the temperature of the PCB is raised evenly over its whole surface to avoid undue stress caused by differential temperatures.

In this example, it is necessary to raise the temperature of the PCB quickly and in accordance with a time-temperature profile, such as that shown in the sketch of FIG. 1. Typically, this can result in the required rate of temperature increase to be in the order of 10° C. per second.

To obtain the best quality of solder joint, it is also necessary, after soldering, to lower the temperature of the PCB quickly.

Methods commonly available to perform automatic soldering are flow soldering machines, tunnel ovens, batch ovens and vapour phase soldering machines.

Tunnel ovens and batch ovens use a variety of methods to heat PCB's, including forced air convection and/or radiant heat. Forced air convection is typically implemented by the use of stationery single or multiple circular nozzles directing the forced hot air down onto the surface of the PCB.

The fundamental problem with using circular nozzles in forced air convection is that hot and cold spots are generated across the surface of the PCB. Each nozzle outputs forced hot air directly downwards onto a surface of the PCB, and as the hot air approaches the surface, it tends to spread radially, as seen in FIG. 2. This leads to the area of a PCB 1 directly beneath a circular nozzle 2 being heated quickly and to a relatively high temperature, the heating effect decreasing as the hot air spreads radially outwards, and a cold spot 3 occurring at the point on the PCB 1 that lies on or substantially on the longitudinal axis of the nozzle 2 due to stagnation.

It will be understood that even if a multiplicity of such nozzles is employed that a multiplicity of hot and cold spots will result.

In order to try and improve and evenness of heating of PCB 1 it would be possible to take a single nozzle 2 (FIG. 2) and traverse it along a path as shown in FIG. 3. If the nozzle were moved with sufficient speed then even heating of PCB 1 might result but the necessary traversing mechanism would be complex and expensive.

Similarly it would be possible to traverse the plate holding a multiplicity of nozzles but it would still be difficult to avoid generating hot and cold spots.

The present invention seeks to overcome these problems.

SUMMARY OF THE INVENTION

According to a first aspect of the invention, there is provided a method of uniformly or substantially uniformly heating at least one surface of a substrate, the method comprising the steps of:

a) supporting the substrate;
b) generating a heated air flow;
c) directing the heated air flow to heat a strip of a first surface of the substrate; and
d) moving the flow path of the heated air in a direction transverse to the direction in which the heated air flow impinges on the substrate until the temperature of the whole or substantially the whole first surface of the substrate has been uniformly or substantially uniformly raised.

The term 'air' as used hereinafter is intended to also cover nitrogen and any other suitable gas and is to be construed accordingly.

Preferable and/or optional features of the first aspect of the invention are set out in claims 2 to 8, inclusive.

According to a second aspect of the invention, there is provided Apparatus for uniformly or substantially uniformly heating at least one surface of a substrate, the apparatus comprising means for supporting the substrate, means for generating a heated air flow, means for directing the said air flow to heat a strip of a first surface of the substrate, and means for moving the flow path of the heated air until the first surface of the substrate is heated.

Preferable and/or optional features of the second aspect of the invention are set out in claims 10 to 16, inclusive.

The invention will now be more particularly described, by way of example, with reference to the accompanying drawings.

DESCRIPTION OF THE PREFERRED EMBODIMENTS

Figure 1:
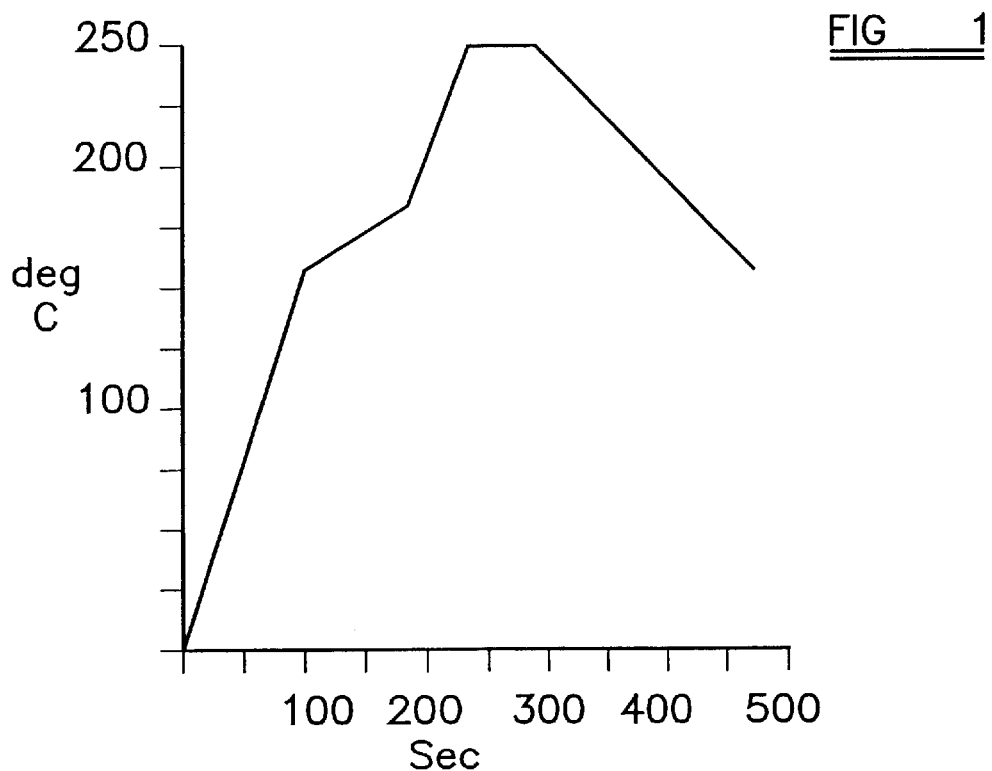
FIG. 1 is a sketch of a desirable temperature-time profile when heating a PCB.
Figure 2:
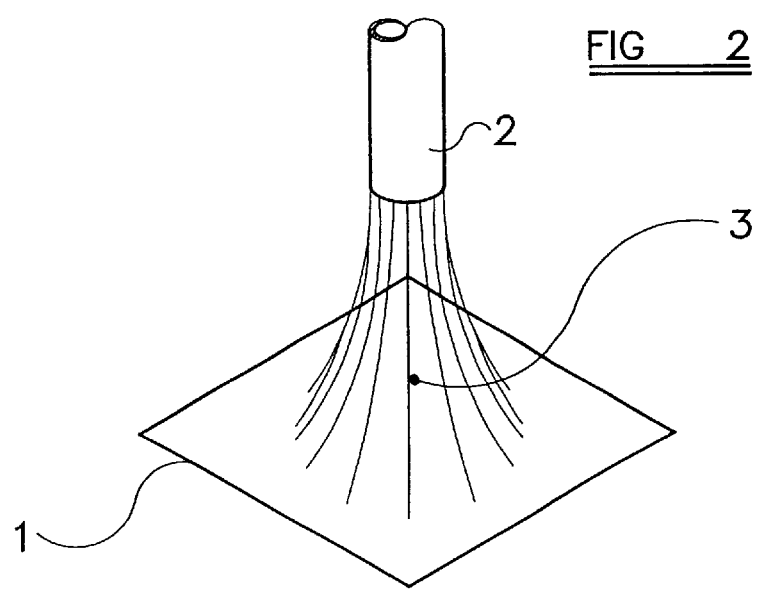
FIG. 2 is a perspective view of a prior art nozzle.
Figure 3:
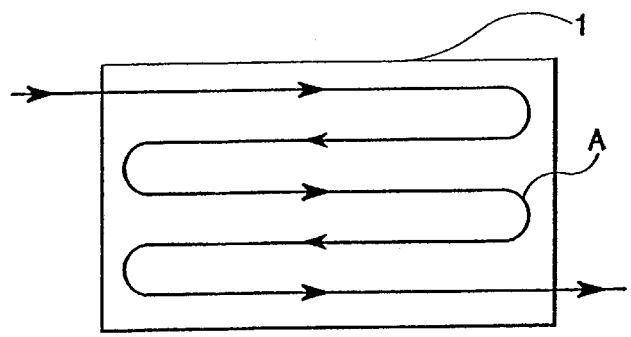
FIG. 3 shows a typical path along which the nozzle of FIG. 2 is moved.
Figure 4:
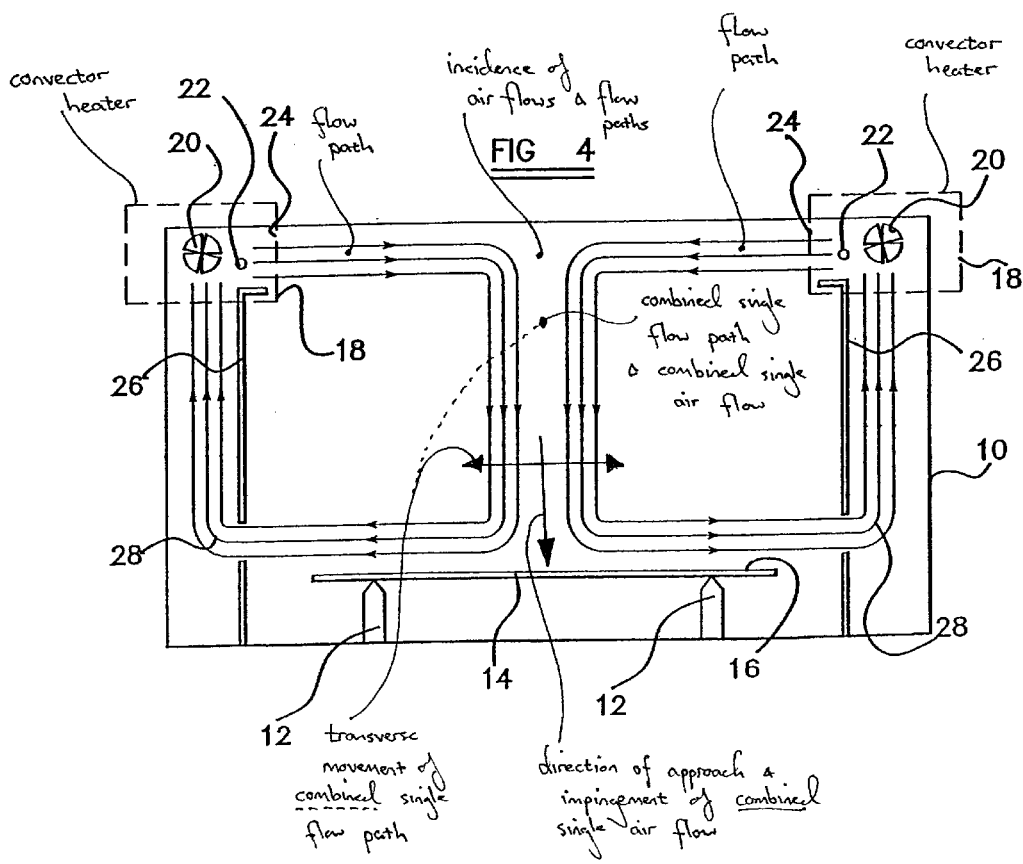
FIG. 4 shows a first embodiment of apparatus for uniformly or substantially uniformly heating one surface of a substrate, in accordance with the second aspect of the invention.

Referring to FIG. 4 of the drawings, a first embodiment of the apparatus shown therein comprises a housing 10, typically being a tunnel oven or a batch oven, and a support 12 disposed in the lower part of the housing 10 and on which a substrate 14 is mountable. In this case, the substrate 14 is a printed circuit board (PCB).

The apparatus also includes means for generating a heated air flow, means for directing the heated air flow to heat a strip of a first surface 16 of the PCB 14, and means for moving the flow path of the heated air.

The heated air flow generation means comprises two heaters, typically in the form of convector heaters 18. Each convector heater 18 has an elongate crossflow fan 20, an elongate electrical heating element 22 positioned adjacent to and in parallel with the crossflow fan 20, and an elongate outlet 24 from which in use heated air is forcibly output from the heater 18.

The elongate outlets 24 are typically disposed in the housing 10 so as to be in parallel or substantially in parallel with the substrate 14 when it is mounted on the support 12. In this embodiment, the elongate outlets 24 are also positioned to face each other above the mounted PCB 14.

The housing 10 further comprises baffle plates 26 generally positioned adjacent the elongate outlet 24 and extending down past the edges of the PCB 14, when it is mounted on the support 12. The baffle plates 26 each have an opening 28 through which air returning to the heaters 18 can pass.

The symmetrical or substantially symmetrical arrangement of the apparatus leads to an increase in the evenness of the heating of the PCB 14.

The heated air flow directing means takes the form of in use directing the two heated air flows, output from the elongate outlets 24 of the heaters 18, to become incident. This causes the flow path of the heated air to be diverted downwards to impinge on a strip of the first surface 16 of the PCB 14. The said strip generally spans the entire or substantially entire width or length of the PCB 14.

Typically, the downwardly diverted heated air approaches and impinges on the first surface 16 at right angles or substantially at right angles.

Once the heated air flow has impinged on the strip of the first surface 16 of the PCB 14, due to the recirculating air currents generated by the crossflow fans 20 of the heaters 18, the flow path of the heated air will tend to split carrying the heated air in different directions across the first surface 16, through the openings 28 in the baffle plates 26, and back to the heaters 18 for reheating.

The flow path movement means typically comprises a control circuit by which the relative flow rates of the heaters 18 are controlled. This can typically take the form of either operating one of the heaters 18 at a constant rate of operation and varying the rate of operation of the other heater 18, or suitably varying the rates of operation of both of the heaters 18.

In any event, as the flow rate of one heater 18 is increased or decreased relative to the other, the flow path of the downwardly directed heated air will tend to move in a direction transverse to the direction in which the heated air flow approaches and impinges on the first surface 16. This control will generally be performed until the temperature of the whole or substantially the whole first surface 16 of the PCB 14 has been uniformly or substantially uniformly raised in accordance with the desired temperature-time profile.

Figure 5:
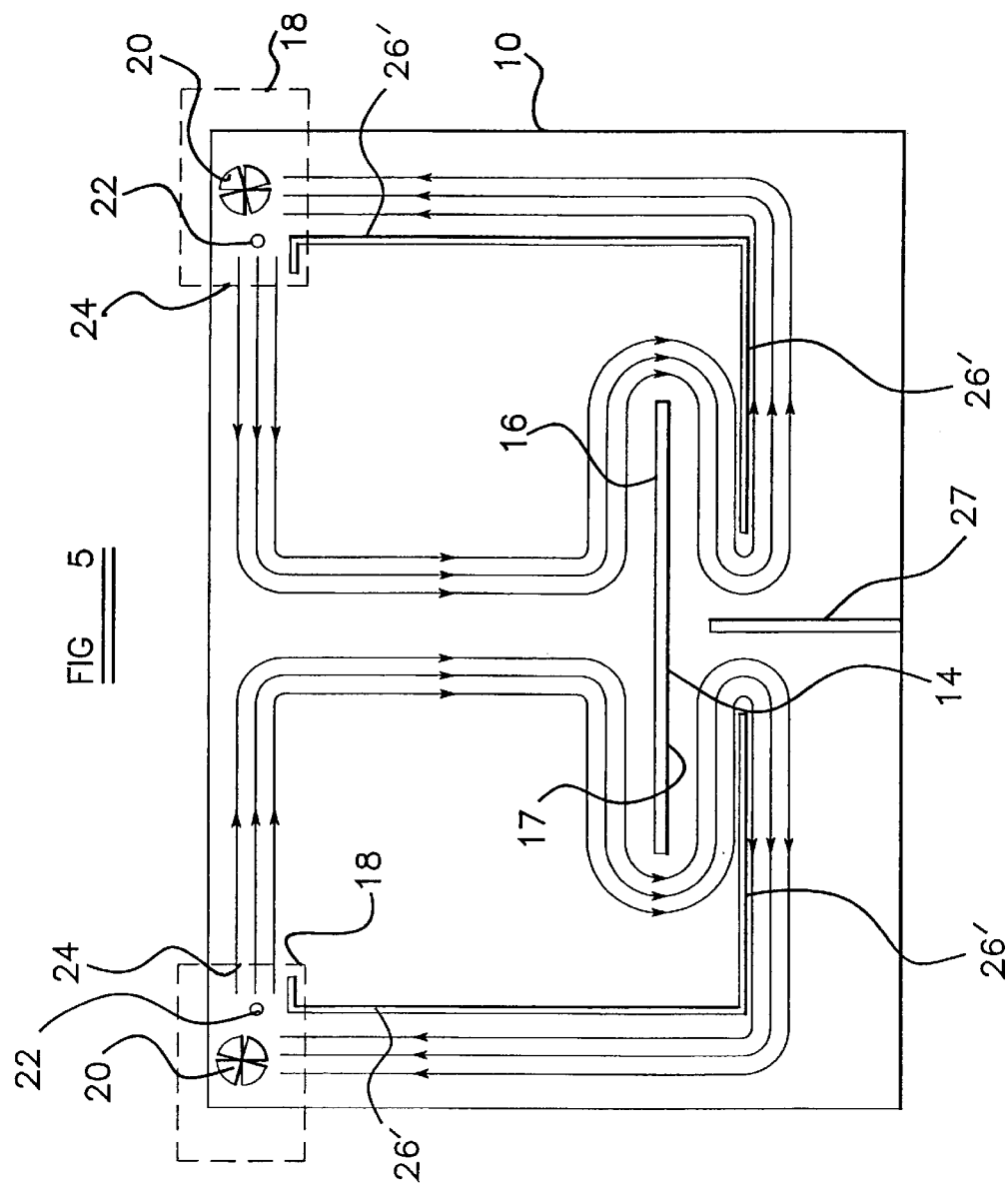
FIG. 5 shows a modification to the first embodiment shown in FIG. 4, in accordance with the second aspect of the invention.

Referring now to FIG. 5, in order to provide under board heating, or to supplement existing under board heating, a modification to the baffle plates 26 of the first embodiment is shown therein. It should be noted that the opening 28 in each baffle plate 26 is typically removed in modified baffle plates 26'.

The baffle plates 26' extend from a position adjacent the elongate outlet 24 to a position beneath the supported PCB 14. An auxiliary baffle plate 27, which acts as a flow path divider, extends from the bottom of the housing 10, at a position midway or substantially midway along the supported PCB 14, towards a second surface 17 of the PCB 14. The baffle plates 26' and 27 are positioned such that the flow path of the downwardly directed heated air is split after the heated air impinges on the first surface 16 and the split flow paths are directed from the first surface 16 around the sides of the PCB 14 and along the second surface 17 before returning to the respective heaters 18. In this way, the temperature of the second surface is also raised.

Figure 6:
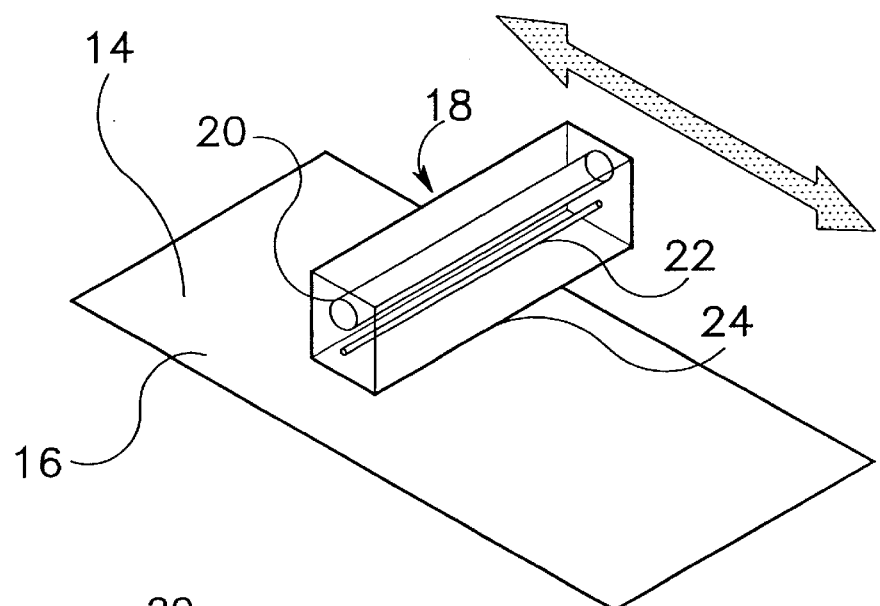
FIG. 6 shows a second embodiment of apparatus for uniformly or substantially uniformly heating one surface of a substrate, in accordance with the second aspect of the invention.
Figure 7:
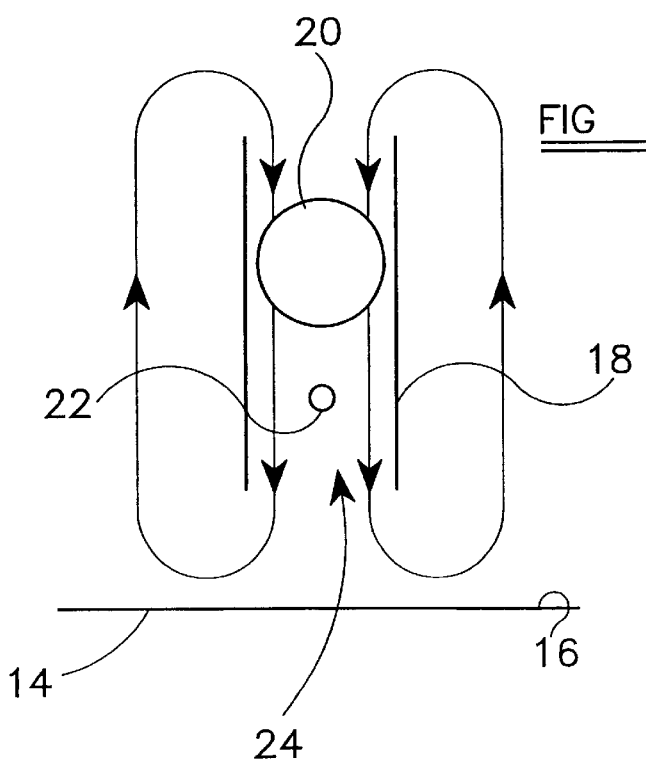
FIG. 7 shows a flow path associated with the second embodiment shown in FIG. 6.

FIGS. 6 and 7 show a second embodiment of the apparatus and like reference numerals correspond to like parts of the first embodiment. The apparatus of the second embodiment typically comprises the support 12 (not shown), on which the PCB 14 can be mounted, means for generating a heated air flow, means for directing the heated air flow to heat a strip of the first surface 16 of the PCB 14, and means for moving the flow path of the heated air.

The heated air flow generation means comprises a heater, again typically in the form of the convector heater 18. The elongate outlet 24 of the heater 18 is typically disposed in parallel or substantially in parallel with the PCB 14 when it is mounted on the support 12. In this embodiment, the elongate outlet 24 is positioned above the PCB 14 to face the first surface 16 thereof.

The heated air flow directing means takes the form of the orientation of the elongate outlet 24 which in use directs the heated air stream output directly towards the first surface 16 of the PCB 14. The heated air thereby impinges on a strip of the first surface 16 of the PCB 14.

Typically, the heated air will approach and impinge on the first surface 16 at right angles or substantially at right angles, similarly to the first embodiment.

Since the crossflow fan 20 generates recirculating air currents and the components of the heater 18 are relatively symmetrical, the flow path of the heated air will be equally or substantially equally split in at least two directions when impinging on the first surface 16 of the PCB 14, as illustrated in FIG. 7, before being drawn back to the heater 18.

The flow path movement means typically comprises a controlled movement mechanism by which the heater 18 can be moved in a direction transverse to the direction in which the heated air flow approaches and impinges on the PCB 14. Typically the movement of the heater 18 can be considered to be a 'scanning' type movement.

The controlled movement mechanism will generally be operated until the temperature of the whole or substantially the whole first surface 16 of the PCB 14 has been uniformly or substantially uniformly raised in accordance with a desired temperature-time profile.

Baffle plates, similar to those of the first embodiment, may or may not be included dependent on necessity.

It will also be understood that the elongate outlet 24 may be in the form of a concertinered attachment enabling, at least in the second embodiment, the outlet 24 to be moved while the rest of the heater 18 remains stationary.

It should also be noted that it may not be necessary for the apparatus of the second embodiment to comprise a housing. This may allow for a portable type of apparatus.

The apparatus described above is given by way of example only and various modifications will be apparent to persons skilled in the art without departing from the scope of the invention. For example, a substrate other than a PCB may be heated by the apparatus; and the heating element 22 may be a gas fired element or any other suitable type of heating element.

What is claimed is:

1. A method of uniformly or substantially uniformly heating at least one surface of a substrate, the method comprising the steps of:
   a) supporting the substrate;
   b) using two convector heaters to generate a heated air flow, each convector heater having at least one elongate outlet from which heated air of the heated air flow is output, each said at least one elongate outlet being positioned to face the other at least one elongate outlet and being in parallel or substantially in parallel with the substrate, and;

c) directing the heated air flow along a flow path towards a first surface of the substrate to heat a strip of said first surface; and d) controlling the relative flow rates of the heaters to move the flow path of the heated air flow in a direction transverse to the direction in which the heated air flow approaches and impinges on the substrate until the temperature of the whole or substantially the whole first surface of the substrate has been uniformly or substantially uniformly raised.

2. A method as claimed in claim 1, further comprising a step (e) between steps (c) and (d) of directing the heated air flows of the combined single air flow from the said first surface to a second surface of the substrate so that the temperature of the second surface is raised.

3. A method as claimed in claim 1, wherein, in steps (c) and (d), the combined single air flow approaches and impinges on the substrate at right angles or substantially at right angles.

4. A method as claimed in claim 1, wherein, in steps (c) and (d), the heated air flow approaches and impinges on the substrate at right angles or substantially at right angles.

5. A method as claimed in claim 1, wherein, in step (a) the substrate is supported in a tunnel oven or a batch oven.

6. Apparatus for uniformly or substantially uniformly heating at least one surface of a substrate, the apparatus comprising means for supporting the substrate, two convector heaters which generate a heated air flow, each convector heater having at least one elongate outlet from which heated air of the heated air flow is output, each said at least one elongate outlet being positioned to face the other at least one elongate outlet and being in parallel or substantially in parallel with the substrate, and control means for controlling the relative flow rates of the convector heaters to move the flow path of the heated air flow in a direction transverse to the direction in which the heated air flow approaches and impinges on the substrate until the first surface of the substrate is heated.

7. Apparatus as claimed in claim 3, wherein the directing means includes one or more baffle plates by which the heated air flows of the combined single air flow can be directed from the first surface to a second surface of the substrate so that the temperature of the second surface is raised.

8. Apparatus as claimed in claim 6, wherein the heated airflow approaches the substrate at right angles or substantially at right angles.

9. Apparatus as claimed in claim 6, wherein the substrate is a printed circuit board (PCB).

10. Apparatus as claimed in claim 6, wherein the substrate is supported by a tunnel oven or a batch oven.

* * * * *